(12) United States Patent
Kuang

(10) Patent No.: US 10,355,247 B2
(45) Date of Patent: Jul. 16, 2019

(54) OLED ENCAPSULATION GLOVEBOX

(71) Applicant: Shenzhen China Star Optoelectronics Technology Co., Ltd., Shenzhen (CN)

(72) Inventor: Youyuan Kuang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 251 days.

(21) Appl. No.: 15/517,162

(22) PCT Filed: Mar. 16, 2017

(86) PCT No.: PCT/CN2017/076864
§ 371 (c)(1),
(2) Date: Apr. 5, 2017

(87) PCT Pub. No.: WO2018/152898
PCT Pub. Date: Aug. 30, 2018

(65) Prior Publication Data
US 2018/0269431 A1    Sep. 20, 2018

(30) Foreign Application Priority Data
Feb. 21, 2017   (CN) .......................... 2017 1 0093729

(51) Int. Cl.
*H01L 51/56* (2006.01)
*E06B 7/23* (2006.01)
(Continued)

(52) U.S. Cl.
CPC .............. *H01L 51/56* (2013.01); *B25J 21/02* (2013.01); *E06B 7/2318* (2013.01); *H01L 51/5237* (2013.01); *H01L 51/50* (2013.01)

(58) Field of Classification Search
CPC .......... B25J 21/02; B08B 15/026; G21F 7/04; E06B 7/2318
See application file for complete search history.

(56) References Cited

U.S. PATENT DOCUMENTS 3,124,852 A * 3/1964 Holderer ................. G01M 9/04
                                                114/201 A
3,356,254 A * 12/1967 Becker ..................... B25J 21/02
                                                2/270
(Continued)

FOREIGN PATENT DOCUMENTS

CN      101097873 A     1/2008
CN      101456185 A     6/2009
(Continued)

*Primary Examiner* — Daniel J Rohrhoff
(74) *Attorney, Agent, or Firm* — Leong C. Lei (57) ABSTRACT

The present invention provides an OLED encapsulation glovebox, which includes a plurality of spaced sealing rings between a box body and a box door to allow the box body, the box door, and the plurality of sealing rings to collectively enclose and delimit therebetween a plurality of sealed spaces between adjacent ones of the sealing rings and positive pressures are maintained in the plurality of sealed spaces to block entry of external moisture and oxygen into the interior of the box body. Compared to the arrangement of the known OLED encapsulation glovebox that keeps a positive pressure in the interior of a box body to prevent entry of external moisture and oxygen, the present invention helps lower down the cost for maintaining positive pressure and provides multiple protection barriers for the internal environment of the box body by arranging a plurality of sealing rings so as to effectively eliminate the situation that invasion of external moisture and oxygen may occur due to breaking or damage of the arrangement of just one single sealing rings.

17 Claims, 6 Drawing Sheets

(51) Int. Cl.
  *B25J 21/02*   (2006.01)
  *H01L 51/52*   (2006.01)
  *H01L 51/50*   (2006.01)

(56) References Cited

U.S. PATENT DOCUMENTS

| | | | | |
|---|---|---|---|---|
| 3,694,962 A | * | 10/1972 | McDonald | E06B 7/2318 220/232 |
| 4,073,521 A | * | 2/1978 | Mena | B63B 19/24 292/1 |
| 4,337,956 A | * | 7/1982 | Hopper | F16J 15/3232 277/552 |
| 4,469,335 A | * | 9/1984 | Moore | A61L 2/26 277/648 |
| 5,316,733 A | | 5/1994 | Rune et al. | |
| 5,711,705 A | * | 1/1998 | Krainiak | A61L 2/208 454/57 |
| 6,235,072 B1 | * | 5/2001 | Kopylov | B01D 46/0023 55/338 |
| 7,780,248 B2 | * | 8/2010 | Granadino | G01M 3/226 312/1 |
| 8,579,387 B2 | * | 11/2013 | Zhang | B25J 21/02 312/1 |
| 8,698,396 B2 | * | 4/2014 | Maindron | H01L 51/56 313/512 |
| 9,895,689 B2 | * | 2/2018 | Wright | A61L 2/208 |
| 2007/0173193 A1 | * | 7/2007 | Li | B08B 15/026 454/370 |
| 2014/0290567 A1 | * | 10/2014 | Mauck | H01L 51/56 118/46 |
| 2015/0068686 A1 | * | 3/2015 | Hindman | B60J 5/14 160/40 |

FOREIGN PATENT DOCUMENTS

| | | |
|---|---|---|
| CN | 204054083 U | 12/2014 |
| CN | 204204919 U | 3/2015 |
| CN | 205950779 U | 2/2017 |

* cited by examiner (Prior Art)
Fig. 1

OLED ENCAPSULATION GLOVEBOX

BACKGROUND OF THE INVENTION

1. Field of the Invention

The present invention relates to the field of display technology, and more particular to an organic light-emitting diode (OLED) encapsulation glovebox.

2. The Related Arts

Organic light-emitting display (OLED) has various advantages, such as being self-luminous, low drive voltage, high luminous efficiency, short response time, high clarity and contrast, almost 180° view angle, wide range of operation temperature, and easy realization of flexible displaying and large-area full-color displaying, and are considered the most promising display devices.

An OLED device is generally made up of a substrate, an anode arranged on the substrate, a hole injection layer arranged on the anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED device often uses an indium tin oxide (ITO) electrode and a metal electrode to respectively serve as the anode and cathode of the device and electrons and holes, when driven by a predetermined electrical voltage, are respectively injected from the cathode and the anode into the electron transport layer and the hole transport layer such that the electrons and the holes respectively migrate through the electron transport layer and the hole transport layer to get into the emissive layer and meet in the emissive layer to form excitons that excite light emissive molecules to emit light, the later undergoing radiation relaxation to give off visible light.

A contemporary mainstream production process for OLED devices is vapor deposition, wherein an organic small molecule material is heated in a vacuum chamber to sublimate or melt and vaporize into vapor of the material that deposits, through openings of a metal mask, onto a glass plate to form the OLED device. Afterwards, encapsulation of the OLED device is conducted in an OLED encapsulation glovebox through an encapsulation process that involves coating a resin frame on a glass or metal back lid.

Figure 1:
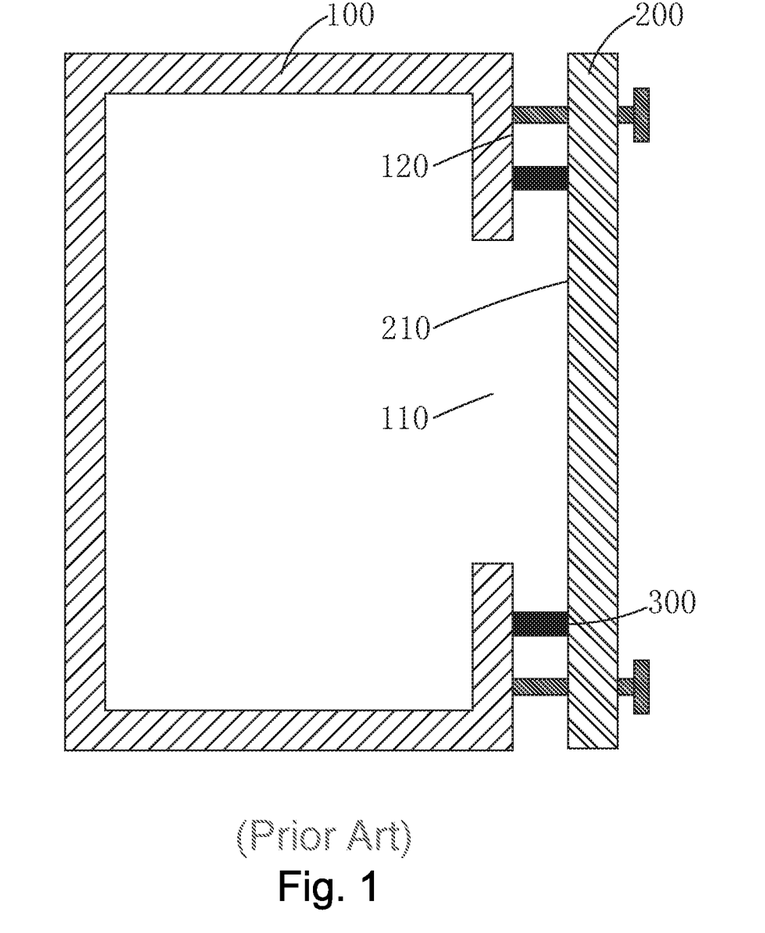
FIG. 1 is a cross-sectional view showing a conventional OLED encapsulation glovebox.
Figure 2:
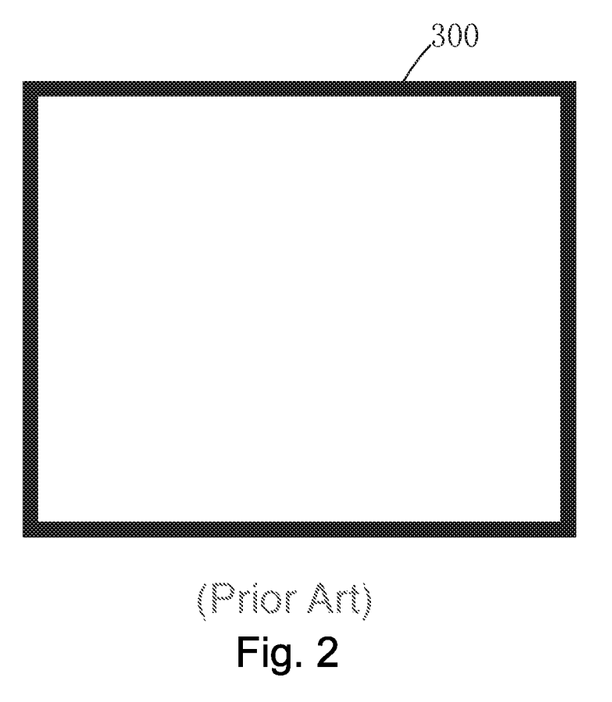
FIG. 2 is a schematic view showing the structure of connection between a box body and a box door of an OLED encapsulation glovebox of FIG. 1.

FIG. 1 is a cross-sectional view showing a conventional OLED encapsulation glovebox, and FIG. 2 is a schematic view illustrating a structure of connection between a box body and a box door. As shown in FIGS. 1 and 2, the OLED encapsulation glovebox comprises a box body 100, a box door 200 that is hermetically connected to the box body 100, and a single sealing ring 300 arranged between the box body 100 and the box door 200. The box body 100 comprises an opening 110 and a first sealing face 120 located around the opening 110. The box door 200 comprises a second sealing face 210 that is arranged opposite to the first sealing face 120. The sealing ring 300 is arranged between the first sealing face 120 and the second sealing face 210 to hermetically connect between the box body 100 and the box door 200.

The box body 100 has an interior that is generally filled with nitrogen gas to maintain a strongly high positive pressure with respect to the outside (namely the pressure in the interior of the box body 100 is far greater than the external atmospheric pressure) in order to prevent external moisture and oxygen from penetrating inwards to thereby provide an excellent moisture/oxygen isolated environment for encapsulation of an OLED device. However, since the box body 100 has a relatively large size, the cost for maintaining the positive pressure is high. Further, since there is only one single sealing 300 provided between the box body 100 and the box door 200, breaking or apertures, once occurring in the sealing ring 300, would lead to invasion of external moisture and oxygen to affect the performance of encapsulation of the OLED device.

SUMMARY OF THE INVENTION

An objective of the present invention is to provide an OLED encapsulation glovebox that exhibits a strong capability of isolating external moisture and oxygen and requires a low cost of maintaining a positive pressure.

To achieve the above objective, the present invention provides an OLED encapsulation glovebox, which comprises a box body, a box door hermetically connected with the box body, and a plurality of sealing rings arranged between the box body and the box door;

wherein the box body comprises an opening and a first sealing face located circumferentially around the opening and the box door comprises a second sealing face that is arranged opposite to the first sealing face, the plurality of sealing rings being arranged between the first sealing face and the second sealing face to provide hermetical connection between the box body and the box door; and the box body, the box door, and the plurality of sealing rings collectively enclose and delimit a plurality of sealed spaces between adjacent ones of the sealing rings and the plurality of sealed spaces each have an internal pressure that is greater than an external atmospheric pressure.

A pressure of an interior of the box body is less than the internal pressures of the sealed spaces.

The box door is securely connected to the box body by a plurality of screws.

Each of the sealed spaces comprises a first gas ingress hole formed in the sealing rings and the first gas ingress hole is connected through a first gas ingress pipe to a gas source so that the gas source supplies gas through the first gas ingress pipe into the sealed spaces.

The first gas ingress pipe comprises a gas regulation valve mounted thereon.

Each of the sealed spaces further comprises a first gas egress hole formed in the sealing rings and the sealed space is connected by the first gas egress hole to a first gas egress pipe.

The first gas egress pipe comprises a gas regulation valve mounted thereto.

Each of the sealed spaces further comprises a first gas egress hole and a second gas ingress hole formed in the sealing rings and the first gas egress hole and the second gas ingress hole are respectively connected by a first gas egress pipe and a second gas ingress pipe to a purification device.

The first gas egress pipe and the second gas ingress pipe each comprise a gas regulation valve mounted thereto.

The box door comprises a plurality of glove joint openings formed therein and a plurality of gloves are respectively connected, in a hermetic manner, to the box door through the plurality of glove joint openings.

The present invention also provides an OLED encapsulation glovebox, which comprises a box body, a box door hermetically connected with the box body, and a plurality of sealing rings arranged between the box body and the box door;

wherein the box body comprises an opening and a first sealing face located circumferentially around the opening and the box door comprises a second sealing face that is arranged opposite to the first sealing face, the plurality of sealing rings being arranged between the first sealing face and the second sealing face to provide hermetical connection between the box body and the box door; and the box body, the box door, and the plurality of sealing rings collectively enclose and delimit a plurality of sealed spaces between adjacent ones of the sealing rings and the plurality of sealed spaces each have an internal pressure that is greater than an external atmospheric pressure;

wherein a pressure of an interior of the box body is less than the internal pressures of the sealed spaces; and wherein the box door is securely connected to the box body by a plurality of screws.

The efficacy of the present invention is that the present invention provides an OLED encapsulation glovebox, which comprises a plurality of spaced sealing rings between a box body and a box door to allow the box body, the box door, and the plurality of sealing rings to collectively enclose and delimit therebetween a plurality of sealed spaces between adjacent ones of the sealing rings and positive pressures are maintained in the plurality of sealed spaces to block entry of external moisture and oxygen into the interior of the box body. Compared to the arrangement of the known OLED encapsulation glovebox that keeps a positive pressure in the interior of a box body to prevent entry of external moisture and oxygen, the present invention helps lower down the cost for maintaining positive pressure and provides multiple protection barriers for the internal environment of the box body by arranging a plurality of sealing rings so as to effectively eliminate the situation that invasion of external moisture and oxygen may occur due to breaking or damage of the arrangement of just one single sealing rings.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Referring to FIGS. 3-6, the present invention provides an organic light emitting display (OLED) encapsulation glovebox, which comprises a box body 10, a box door 20 hermetically connected with the box body 10, and a plurality of sealing rings 30 arranged between the box body 10 and the box door 20 and spaced from each other.

The box body 10 comprises an opening 11 and a first sealing face 12 located circumferentially around the opening 11. The box door 20 comprises a second sealing face 21 that is arranged opposite to the first sealing face 12. The plurality of sealing rings 30 are arranged between the first sealing face 12 and the second sealing face 21 to provide hermetical connection between the box body 10 and the box door 20.

The box body 10, the box door 20, and the plurality of sealing rings 30 collectively enclose and delimit a plurality of sealed spaces 40 between adjacent ones of the sealing rings 30. The plurality of sealed spaces 40 each have an internal pressure that is greater than an external atmospheric pressure.

Preferably, the internal pressures of the plurality of sealed spaces 40 are constant pressures and are identical to each other.

Since the internal pressures of the plurality of sealed spaces 40 are all greater than the external atmospheric pressure, namely they are kept in positive pressures, it is possible to block external moisture/oxygen from penetrating into an interior of the box body 10 thereby providing an excellent moisture/oxygen isolated environment for encapsulation of an OLED device.

The OLED encapsulation glovebox according to the present invention uses the plurality of sealed spaces 40 to maintain a positive pressure with respect to the outside in order to prevent external moisture/oxygen from entering the interior of the box body 10 so that there is no need for the interior of the box body 10 to maintain a positive pressure with respect to the outside to block external moisture/oxygen from entering. Thus, the interior of the box body 10 can be maintained at any desired pressure. Preferably, the internal pressure of the box body 10 is less than the internal pressures of the sealed spaces 40 in order to reduce the cost necessary for keeping the internal pressure of the box body 10.

Since the plurality of sealed spaces 40 are each of a relatively small volume, while the box body 10 has a relatively large size, for conditions of maintaining the same positive pressure, the cost for maintaining positive pressures internal of the plurality of sealed spaces 40 is relatively low, while the cost for maintaining a positive pressure in the interior of the box body 10 is relatively high. As such, compared to the arrangement of the known OLED encapsulation glovebox that keeps a positive pressure in the interior of the box body to block entry of external moisture and oxygen, the OLED encapsulation glovebox according to the present invention that prevents entry of external moisture and oxygen by providing a positive pressure in the plurality of sealed spaces 40 allows for reduction of the cost for maintaining a positive pressure and, in addition, through the arrangement of the plurality of sealing rings 30, the environment of the interior of the box body 10 is provided with multiple protection barriers that help eliminate the situation that invasion of external moisture and oxygen may occur due to breaking or damage of the arrangement of just one single sealing rings 30.

Figure 3:
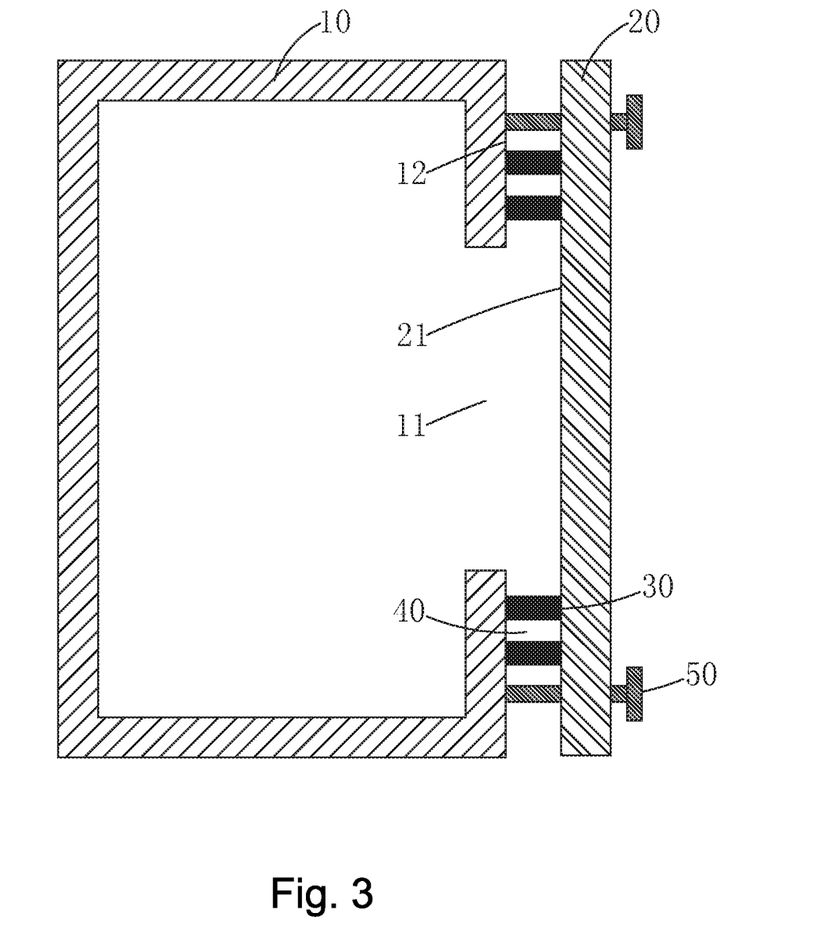
FIG. 3 is a cross-sectional view showing an OLED encapsulation glovebox according to the present invention.

Specifically, as shown in FIG. 3, the box door 20 is securely connected to the box body 10 by a plurality of screws 50.

Specifically, the interior of the box body 10 and the plurality of sealed spaces 40 are all filled with a gas. Preferably, the gas is nitrogen gas.

Figure 4:
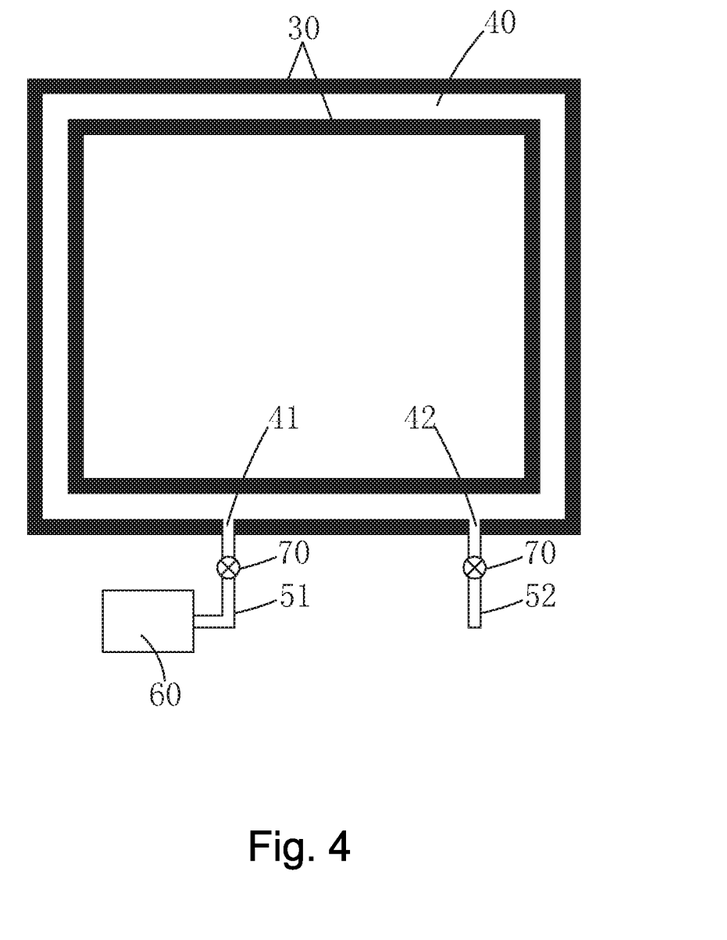
FIG. 4 is a schematic view showing the structure of connection between a box body and a box door of a first embodiment of the OLED encapsulation glovebox according to the present invention.
Figure 5:
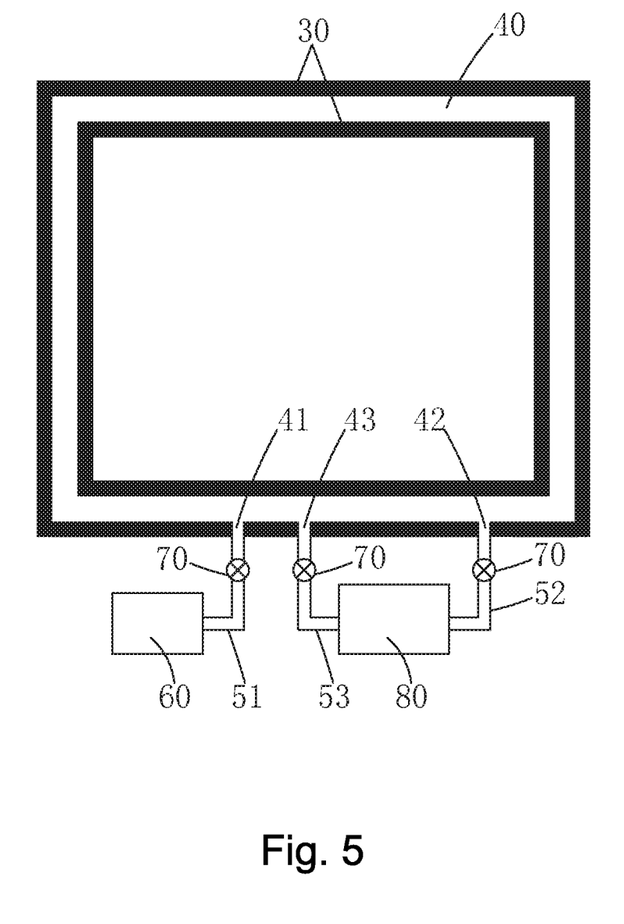
FIG. 5 is a schematic view showing the structure of connection between a box body and a box door of a second embodiment of the OLED encapsulation glovebox according to the present invention.

As shown in FIGS. 4 and 5, each of the sealed spaces 40 comprises a first gas ingress hole 41 formed in the sealing rings 30 and the first gas ingress hole 41 is connected by a first gas ingress pipe 51 to a gas source 60 so that the gas source 60 supplies, via the first gas ingress pipe 51, a gas into the sealed spaces 40.

Preferably, the first gas ingress pipe 51 is provided with a gas regulation valve 70 to regulate and adjust gas ingress flow rate and flow speed.

FIG. 4 is a schematic view showing the structure of connection between a box body and a box door of the OLED encapsulation glovebox according to a first example of the present invention. In the first example, each of the sealed spaces 40 is also provided with a first gas egress hole 42 formed in the sealing rings 30. The sealed spaces 40 discharge an excessive amount of gas outwards by being connected through the first gas egress hole 42 to a first gas egress pipe 52 so as to maintain the interiors of the sealed spaces 40 at a suitable pressure.

Preferably, the first gas egress pipe 52 is provided with a gas regulation valve 70 to regulate and adjust gas egress flow rate and flow speed.

FIG. 5 is a schematic view showing the structure of connection between a box body and a box door of the OLED encapsulation glovebox according to a second example of the present invention. In the second example, each of the sealed spaces 40 is also provided with a first gas egress hole 42 and a second gas ingress hole 43 formed in the sealing rings 30. The first gas egress hole 42 and the second gas ingress hole 43 are respectively connected by a first gas egress pipe 52 and a second gas ingress pipe 53 to a purification device 80 such that gas contained in the sealed spaces 40 is introduced through a first gas egress pipe 52 into the purification device 80 to allow moisture/oxygen that leaks from the outside environment into the sealed spaces 40 can be absorbed and thus removed by the purification device 80 to help maintain purity of the gas inside the sealed spaces 40. The gas that has been subjected to absorption and purification is conducted through a second gas ingress pipe 53 back into the sealed spaces 40, so as to achieve recycling and repeated use of the gas located in the sealed spaces 40 to thereby improve utilization of gas.

Preferably, the first gas egress pipe 52 and the second gas ingress pipe 53 are each provided with a gas regulation valve 70 to regulate and adjust flow rate and flow speed of egress and ingress of gas.

Figure 6:
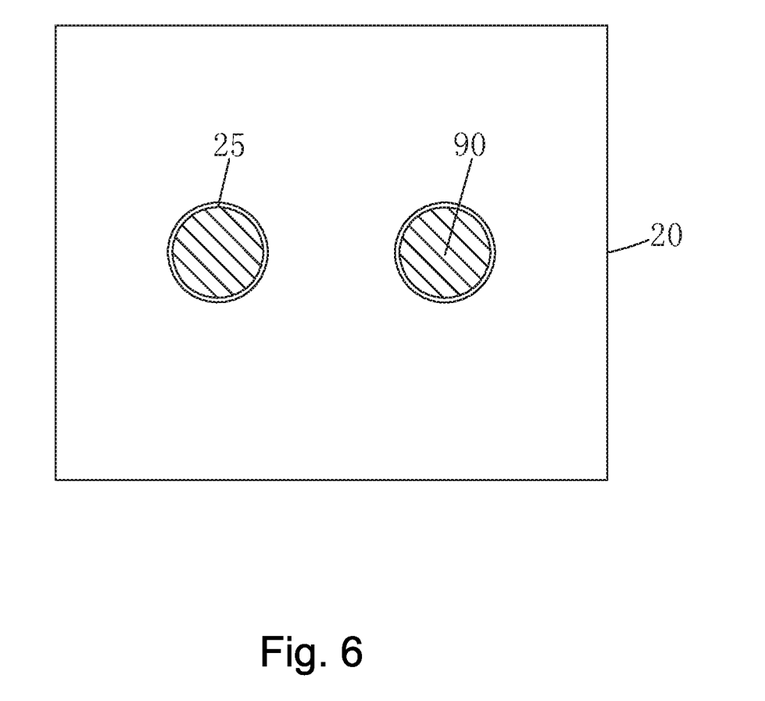
FIG. 6 is a front view showing the box door of the OLED encapsulation glovebox according to the present invention.

FIG. 6 is a front view showing the box door of the OLED encapsulation glovebox according to the present invention. As shown in FIG. 6, the box door 20 is provided with a plurality of glove joint openings 25, and a plurality of gloves 90 are respectively connected, in a hermetic manner, to the box door 20 through the plurality of glove joint openings 25. An operator is allowed to conduct a manufacturing operation inside the box body 10 through use of the plurality of gloves 90.

Specifically, the box door 20 is in a light-transmitting form so that the operator, in conducting a manufacturing operation inside the box body 10, may observe, from the outside, the performance of the manufacturing operation inside the box body 10.

In summary, the present invention provides an OLED encapsulation glovebox, which comprises a plurality of spaced sealing rings 30 between a box body 10 and a box door 20 to allow the box body 10, the box door 20, and the plurality of sealing rings 30 to collectively enclose and delimit therebetween a plurality of sealed spaces 40 between adjacent ones of the sealing rings 30 and positive pressures are maintained in the plurality of sealed spaces 40 to block entry of external moisture and oxygen into the interior of the box body 10. Compared to the arrangement of the known OLED encapsulation glovebox that keeps a positive pressure in the interior of a box body to prevent entry of external moisture and oxygen, the present invention helps lower down the cost for maintaining positive pressure and provides multiple protection barriers for the internal environment of the box body 10 by arranging a plurality of sealing rings 30 so as to effectively eliminate the situation that invasion of external moisture and oxygen may occur due to breaking or damage of the arrangement of just one single sealing rings 30.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An organic light emitting display (OLED) encapsulation glovebox, comprising a box body, a box door hermetically connected with the box body, and a plurality of sealing rings arranged between the box body and the box door;
   wherein the box body comprises an interior space, an opening in communication with the interior space, and a first sealing face located circumferentially around the opening and the box door comprises a second sealing face that is arranged opposite to the first sealing face, the plurality of sealing rings being arranged between the first sealing face and the second sealing face to provide hermetical connection between the box body and the box door; and
   the box body, the box door, and the plurality of sealing rings collectively enclose and delimit a plurality of sealed spaces between adjacent ones of the sealing rings and the plurality of sealed spaces each have an internal pressure that is greater than an external atmospheric pressure; and
   wherein the opening of the box body is closed by the box door and the interior space of the box body is sealed by the box door and the plurality of sealing rings to provide a primary sealed space in the interior of the box body and wherein the primary sealed space has an internal pressure that is less than the internal pressures of the sealed spaces between the box body and the box door, such that the internal pressures of the sealed spaces are different.

2. The OLED encapsulation glovebox as claimed in claim 1, wherein the box door is securely connected to the box body by a plurality of screws.

3. The OLED encapsulation glovebox as claimed in claim 1, wherein each of the sealed spaces comprises a first gas ingress hole formed in the sealing rings and the first gas ingress hole is connected through a first gas ingress pipe to a gas source so that the gas source supplies gas through the first gas ingress pipe into the sealed spaces.

4. The OLED encapsulation glovebox as claimed in claim 3, wherein the first gas ingress pipe comprises a gas regulation valve mounted thereon.

5. The OLED encapsulation glovebox as claimed in claim 3, wherein each of the sealed spaces further comprises a first gas egress hole formed in the sealing rings and the sealed space is connected by the first gas egress hole to a first gas egress pipe.

6. The OLED encapsulation glovebox as claimed in claim 5, wherein the first gas egress pipe comprises a gas regulation valve mounted thereto.

7. The OLED encapsulation glovebox as claimed in claim 3, wherein each of the sealed spaces further comprises a first gas egress hole and a second gas ingress hole formed in the sealing rings and the first gas egress hole and the second gas ingress hole are respectively connected by a first gas egress pipe and a second gas ingress pipe to a purification device.

8. The OLED encapsulation glovebox as claimed in claim 7, wherein the first gas egress pipe and the second gas ingress pipe each comprise a gas regulation valve mounted thereto.

9. The OLED encapsulation glovebox as claimed in claim 1, wherein the box door comprises a plurality of glove joint openings formed therein and a plurality of gloves are respectively connected, in a hermetic manner, to the box door through the plurality of glove joint openings.

10. An organic light emitting display (OLED) encapsulation glovebox, comprising a box body, a box door hermetically connected with the box body, and a plurality of sealing rings arranged between the box body and the box door;
   wherein the box body comprises an interior space, an opening in communication with the interior space, and a first sealing face located circumferentially around the opening and the box door comprises a second sealing face that is arranged opposite to the first sealing face, the plurality of sealing rings being arranged between the first sealing face and the second sealing face to provide hermetical connection between the box body and the box door; and
   the box body, the box door, and the plurality of sealing rings collectively enclose and delimit a plurality of sealed spaces between adjacent ones of the sealing rings and the plurality of sealed spaces each have an internal pressure that is greater than an external atmospheric pressure;
   wherein the opening of the box body is closed by the box door and the interior space of the box body is sealed by the box door and the plurality of sealing rings to provide a primary sealed space in the interior of the box body and wherein the primary sealed space has an internal pressure of that is less than the internal pressures of the sealed spaces between the box body and the box door, such that the internal pressures of the sealed spaces are different; and
   wherein the box door is securely connected to the box body by a plurality of screws.

11. The OLED encapsulation glovebox as claimed in claim 10, wherein each of the sealed spaces comprises a first gas ingress hole formed in the sealing rings and the first gas ingress hole is connected through a first gas ingress pipe to a gas source so that the gas source supplies gas through the first gas ingress pipe into the sealed spaces.

12. The OLED encapsulation glovebox as claimed in claim 11, wherein the first gas ingress pipe comprises a gas regulation valve mounted thereon.

13. The OLED encapsulation glovebox as claimed in claim 11, wherein each of the sealed spaces further comprises a first gas egress hole formed in the sealing rings and the sealed space is connected by the first gas egress hole to a first gas egress pipe.

14. The OLED encapsulation glovebox as claimed in claim 13, wherein the first gas egress pipe comprises a gas regulation valve mounted thereto.

15. The OLED encapsulation glovebox as claimed in claim 11, wherein each of the sealed spaces further comprises a first gas egress hole and a second gas ingress hole formed in the sealing rings and the first gas egress hole and the second gas ingress hole are respectively connected by a first gas egress pipe and a second gas ingress pipe to a purification device.

16. The OLED encapsulation glovebox as claimed in claim 15, wherein the first gas egress pipe and the second gas ingress pipe each comprise a gas regulation valve mounted thereto.

17. The OLED encapsulation glovebox as claimed in claim 10, wherein the box door comprises a plurality of glove joint openings formed therein and a plurality of gloves are respectively connected, in a hermetic manner, to the box door through the plurality of glove joint openings.

* * * * *